United States Patent [19]
Leuschner et al.

[11] Patent Number: 6,042,993
[45] Date of Patent: *Mar. 28, 2000

[54] PHOTOLITHOGRAPHIC STRUCTURE GENERATION PROCESS

[75] Inventors: Rainer Leuschner, Weisendorf; Ewald Günther, Herzogenaurach; Albert Hammerschmidt; Gertrud Falk, both of Erlangen, all of Germany

[73] Assignee: Siemens Aktiengesellschaft, München, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/875,957
[22] PCT Filed: Jan. 29, 1996
[86] PCT No.: PCT/DE96/00116
§ 371 Date: Aug. 7, 1997
§ 102(e) Date: Aug. 7, 1997
[87] PCT Pub. No.: WO96/24887
PCT Pub. Date: Aug. 15, 1996

[30] Foreign Application Priority Data

Feb. 10, 1995 [DE] Germany .................... 195 04 477

[51] Int. Cl.$^7$ ................ H01L 21/00; G03F 7/00
[52] U.S. Cl. ............... 430/296; 430/313; 430/942; 250/492.3
[58] Field of Search ..................... 430/313, 296, 430/942; 250/492.2, 492.3

[56] References Cited

U.S. PATENT DOCUMENTS 5,378,316  1/1995  Franke et al. ................... 216/2
5,656,128  8/1997  Hashimoto et al. ............... 430/318

OTHER PUBLICATIONS

Fujino, T. et al., "The surface silylating process using chemical amplification resist for electron beam lithography," J. Vac. Sci. Technol. B 8(6), Nov./Dec. 1990, pp. 1808–1813.

Pang, S. et al., "Plasma–deposited amorphous carbon films as planarization layers," J. Vac. Sci. Technol. B 8(6), Nov./Dec. 1990, pp. 1980–1984.

Dobisz, E. et al., "Scanning tunneling microscope lithography: A solution to electron scattering," J. Vac. Sci. Technol. B 9(6), Nov./Dec. 1991, pp. 3024–3027.

Irmscher, M. et al., "Comparative evaluation of chemically amplified resists for electron–beam top surface imaging use," J. Vac. Sci. Technol. B 12(6), Nov./Dec. 1994, pp. 3925–3929.

Marrian, C. et al., "High Resolution Patterning With The STM," P. Avouris (ed.), Atomic and Nanometer–Scale Modification of Materials: Fundamentals and Applications, Kluwer Academic Publishers, 1993, pp. 139–148.

McCord, M. et al., "Exposure of calcium fluoride resist with the scanning tunneling microscope," J. Vac. Sci. Technol. B 5(1), Jan./Feb. 1987, pp. 430–433.

Leuschner, R. et al., "Progress in Deep–UV Resists Using CARL Technology, " Polymer Engineering and Science, Mid–Nov. 1992, vol. 32, No. 21, pp. 1558–1564.

Gogolides, E. et al., "Wet silylation and dry development with the AZ 5214™ photoresist," J. Vac. Technol. B 10(6), Nov./Dec. 1992 pp. 2610–2614.

*Primary Examiner*—Sharon Gibson
*Assistant Examiner*—Jill N. Holloman
*Attorney, Agent, or Firm*—Kenyon & Kenyon

[57] ABSTRACT

In a process for photolithographic generation of structures in the sub-200 nm range, a layer of amorphous hydrogen-containing carbon (a-C:H) with an optical energy gap of <1 eV or a layer of sputtered amorphous carbon (a-C) is applied as the bottom resist to a substrate (layer thickness ≦500 nm); the bottom resist is provided with a layer of an electron beam-sensitive silicon-containing or silylatable photoresist as the top resist (layer thickness ≦50 nm); the top resist is structured by means of scanning tunneling microscopy (STM) or scanning force microscopy (SFM) with electrons of an energy of ≦80 eV; and then the structure is transferred to the bottom resist by etching with an anisotropic oxygen plasma and next is transferred to the substrate by plasma etching.

15 Claims, No Drawings

PHOTOLITHOGRAPHIC STRUCTURE GENERATION PROCESS

BACKGROUND OF THE INVENTION

The invention concerns a process for photolithographic generation of structures in the range below 200 nm.

In semiconductor technology and in microelectronics, the dimensions of structures are becoming smaller and smaller. In memory production today, structures with a width of less than 400 nm are produced using optical lithography in combination with the masking technique. A limit can be expected at approx. 150 nm in optical lithography because of diffraction effects. However, structures with even smaller dimensions are required for new applications such as single-electron transistors or molecular electronic components. In the case of very high-frequency circuits this is also true in conventional electronics.

One method offering possibilities for generating such small structures is X-ray lithography, which makes it possible to image dimensions of less than 100 nm—because of the shorter wavelength. However, this leads to problems with the required masks and in positioning. This is not the case with electron and ion beam lithography. Since these are direct writing methods, they do not require any masks. In electron and ion beam lithography, structures as small as 10 nm can be generated with high-energy particles. However, this requires expensive vacuum systems and beam guidance systems. In addition, problems can occur with sensitive components due to radiation damage in the substrate, because the high-energy particles can penetrate through the resist layers required for etching processes.

A novel possibility for high-resolution structuring is presented by scanning near-field techniques, in particular scanning tunneling microscopy (STM) and scanning force microscopy (SFM). With regard to writing speed, these techniques are in principle slower than electron beam writing methods but it is possible to work in parallel with a series of near-field probes. In addition, the writing speed and thus the time should not be crucial for initial developments because the method yields the great advantage that expensive vacuum systems can be eliminated.

With scanning near-field techniques, a fine pointed probe is moved over the surface of the specimen at a constant distance, and topographic differences can be compensated in this way. Interactions between the specimen surface and the tip of the probe serve to regulate the distance. When these techniques, which are usually employed only for scanning surface topographies, are to be used as structuring methods, then a current flow is generated, using an externally applied voltage, from the tip of the probe into the specimen or vice versa, depending on the polarity of the voltage, causing a chemical or physical change in the specimen surface. Since the distance between the tip of the probe and the surface of the specimen is extremely small, collisions between the electrons emitted and the molecules of air can be disregarded, and therefore electron exposure of the specimen surface is possible with scanning near-field techniques not only in high vacuum but also at normal pressure. This is an important advantage in comparison with the actual electron beam writing, where high vacuum is required—to prevent collisions between electrons and residual gas molecules in the acceleration zone (1–50 kV)—which entails a considerable expenditure.

With scanning near-field techniques, the electrons emitted cannot be accelerated to a high kinetic energy. In other words, if the voltage applied to the probe is too high (approx. >80 V), uncontrolled damage may occur to the specimen and probe. Thus only electrons with an energy of up to approx. 80 eV may be used for electron bombardment with scanning near-field probes. This energy level is sufficient to initiate chemical changes in conventional electron beam-sensitive resist materials, but it is not great enough for the electrons to penetrate through dielectric resist layers more than a few 10 nm thick. The advantage that radiation damage in the substrate is ruled out has thus so far been outweighed by the disadvantage that only extremely thin resist layers can be used.

In microelectronics, however, plasma processing methods such as reactive ion etching (RIE) are conventional and require structurable, etching-resistant masks in the form of resists with a layer thickness of >100 nm, depending on the etching depth of the structures to be produced.

Therefore, when using scanning near-field techniques, it is necessary to either refrain from substrate etching by plasma etching processes, in which case, however, the aspect ratio of the structures produced (height/width) is limited to values of <1—or the etching processes must be performed in such a way that the etching depth does not exceed the thickness of the resist (see P. Avouris (ed.) *Atomic and Nanometer-Scale Modification of Materials. Fundamentals and Applications*, Kluwer Academic Publishers, 1993, pages 139–148). Another possibility consists of using metal halides, in particular calcium fluoride ($CaF_2$), which have the etching stability required for substrate etching processes even in a thin layer (see *Journal of Vacuum Science & Technology B*, vol. 5 (1987), pages 430–433). However, the lithographic properties of such inorganic materials are very poor, in particular the dose required for structuring is very high, amounting to 1 $C/cm^2$ for a 20 nm thick $CaF_2$ resist, for example. This in turn limits the writing speed and therefore the throughput.

SUMMARY OF THE INVENTION

The object of this invention is to provide a process that will make it possible to produce sub-200 nm structures with a high aspect ratio by means of low-energy electrons at normal pressure while at the same time permitting structuring of thick resist layers (>100 nm).

This is accomplished according to this invention by applying a layer of amorphous hydrogenous carbon with an optical energy gap of <1 eV or a layer of sputtered amorphous carbon to a substrate as a bottom resist, where the layer thickness is $\leq 500$ nm, providing the bottom resist with a layer of an electron beam-sensitive, silicon-containing or silylatable photoresist with a layer thickness of $\leq 50$ nm as a top resist, structuring the top resist by scanning tunneling microscopy or scanning force microscopy with electrons of an energy of $\leq 80$ eV, and transferring the structure first to the bottom resist by etching with an anisotropic oxygen plasma and then to the substrate by plasma etching.

DETAILED DESCRIPTION OF THE INVENTION

The process according to this invention contains a series of important measures. Thus, a two-layer resist system with a top resist (top layer) and a bottom resist (bottom layer) is used. The top resist is a thin electron beam-sensitive photoresist (layer thickness $\leq 50$ nm). This photoresist, which may be a positive or negative resist, either contains silicon or can be silylated. A silylatable resist offers the advantage that the layer thickness can be increased by a chemical aftertreatment and the etching stability in the oxygen plasma can be increased. The bottom resist is a relatively thick layer (≦500 nm) of amorphous hydrogenous carbon (a-C:H) and having an optical energy gap of <1 eV, or sputtered amorphous carbon (a-C). Such a resist material has the following properties:

it has a sufficient electric conductivity,
it can be applied as a thin, homogeneous, closed film,
it does not contain any ionic impurities,
it is not attacked by the solvent for the top resist,
it can easily be etched in an oxygen plasma without leaving a residue,
it has a high stability in etching processes with halogen-containing plasmas.

Layers of a-C:H with the properties described above can be created by deposition from a hydrocarbon plasma, specifically according to a so-called PECVD process (plasma enhanced chemical vapor deposition). The process parameters, i.e., the type of gas, the gas pressure and the self-bias voltage—determined by the power and the reactor geometry—are selected so that this material has a sufficiently small optical energy gap (<1 eV) or a sufficient electric conductivity ($\geq 10^{-5}$ $\Omega^{-1} \cdot cm^{-1}$). As a result, low-energy electrons can be removed through the bottom resist layer.

Suitable a-C layers can be obtained by sputtering from a graphite target in a conventional sputtering system, where sputtering parameters that yield smooth adhesive layers are maintained. The substrate on which the material is deposited must optionally be pretreated by a suitable cleaning process (argon or oxygen plasma).

In the process according to this invention, the top resist is irradiated and structured with low-energy electrons (voltage ≦80 V) by means of a scanning tunneling microscope or a scanning force microscope. The radiation dose advantageously used is 1–50 mC/cm$^2$, preferably 10–30 mC/cm$^2$. The structure produced is then transferred with the help of an anisotropic oxygen plasma ($O_2$-RIE) to the bottom resist, i.e., to the a-C:H layer or the a-C layer, and is then transferred to the substrate by plasma etching. Transfer of the structure to the substrate is generally accomplished by means of a halogen plasma such as tetrafluromethane ($CF_4$); other suitable halogen plasmas include chlorine ($Cl_2$), boron trichloride ($BCl_3$) and sulfur hexafluoride ($SF_6$). An oxygen plasma is used for transfer of the structure to substrates such as polyimide.

The measures described above yield the effect that great etching depths can be achieved in the substrate with a very thin photoresist. The etching depth in the substrate depends on the etching selectivity of the substrate in comparison with the bottom resist layer (of a-C:H or a-C). Since a-C:H layers may be under stress, they are deposited in principle only on materials where there is good adhesion. Deposition on the most common substrate materials in semiconductor technology, such as monocrystalline silicon, polycrystalline silicon, $SiO_2$, quartz, $Si_3N_4$, SiC, aluminum and polyimide, is possible without problems; with gallium arsenide, the layer thickness that can be deposited is generally limited to values of less than 200 nm. For the etching selectivity (substrate: a-C:H) in a plasma excited by radiofrequency, the following values are obtained, for example: polycrystalline silicon 6:1 ($Cl_2$; 800 W/3.7 $\mu$bar), $SiO_2$ 20:1 ($CF_4$; 700 W/5 $\mu$bar), aluminum 5:1 ($SiCl_4+Cl_2+N_2$; 360 W/0.16 mbar), polyimide 2:1 ($O_2$; 900 W/3 $\mu$bar). On copper and tungsten, a-C:H cannot be deposited directly, so in these cases an intermediate layer of aluminum is used.

Layers of a-C have a lower stress and can therefore be deposited on all conventional substrate materials, including copper and tungsten. These layers have an etching stability comparable to that of a-C:H. However, layers of a-C are not permeable to visible light, so it may be difficult to locate adjusting marks, and optical layer thickness measurements are impossible under some circumstances.

Materials that need only a low dose for exposure are preferred as the electron beam-sensitive top resists. This is the case in particular with resists that work according to the principle of chemical amplification (chemically amplified resists). Writing time can be minimized with such resists, which are also used in electron beam lithography (dose required at 30 keV: <10 $\mu C/cm^2$).

It is advantageous to use top resists that can be silylated, which is performed after structuring. Such a resist has functional groups that are capable of reacting with agents containing silicon. Such groups include in particular anhydride groups, which can be reacted with aminopropylsiloxanes, for example, and hydroxyl groups that can be reacted with silazanes. For chemical aftertreatment of the resists, solutions of functional silicon compounds of the aforementioned type are used, such as those known for the corresponding resist materials (see, for example, *Polymer Engineering and Science*, vol. 32 (1992) pages 1558–1564, and *Journal of Vacuum Science & Technology B*, vol. 10 (1992) pages 2610–2614). Moreover, spaces (positive images) or lines (negative images) may also be produced, depending on how the resist process is carried out.

The invention is explained in greater detail below on the basis of the following examples.

EXAMPLE 1

A silicon wafer is coated with amorphous hydrogen-containing carbon (layer thickness: 450 nm)—with an optical energy gap of 0.85 eV—in a methane-filled PECVD system (parallel plate reactor, 3-inch cathode with a 13.56 MHz transmitter, anode six times larger); deposition parameters: −900 V self-bias voltage, 0.1 mbar methane pressure, 7 min deposition time. Then a 45 nm thick layer of an electron beam-sensitive resist is applied to this layer by spin coating and dried at 120° C. for 60 s on a hot plate; the resist is based on a basic polymer with anhydride groups and tert-butyl ester groups (see U.S. patent application Ser. No. 08/386,136 . The top layer is then "exposed" by means of a scanning tunneling microscope (STM device) by the fact that the tip of the probe to which −50 V is applied scans the specimen at the rate of 1 $\mu$m/s and thus "writes" lines (current: 10 pA). Then the wafer is heated at 120° C. for 120 s on a hot plate and then developed for 60 s in an aqueous developer solution of tetramethylammonium hydroxide (1.19%) and 1-phenylethylamine (0.25%), where 150 nm wide spaces are formed according to the scan pattern (positive image); the dark field erosion in developing amounts to 5 nm. Next, the wafer is treated for 60 s with a silylation solution consisting of a 4% solution of diaminopropyldimethylsiloxane oligomer in a mixture of 2-propanol and ethanol (ratio 2:1). The layer thickness of the resist increases by 45 nm to a total of 85 nm, and the space width decreases from 150 nm to 80 nm. The structures produced in this way are transferred to the amorphous hydrogen-containing carbon layer by means of a plasma etching system (model MIE 720, MRC) at an RF power of 900 W (45 V self-bias voltage) and an oxygen flow of 30 sccm (3 $\mu$bar). The etching time is 84 s (including 50% overetching), where the thickness of the photoresist layer decreases to 15 nm and the space width of the structures increases to 100 nm. The aspect ratio of the structures in the carbon layer is thus 4.5. The resist structure is then transferred to the silicon wafer by means of a $CF_4$ plasma, where the maximum possible etching depth is determined by the resist layer thickness and the etching selectivity; in the present case this is 6×450 nm. In practice, however, the etching depth amounts to less than 50% of the maximum value.

The structure widths of approx. 100 nm that can be achieved can be further greatly reduced by optimizing the writing parameters. Because of the lack of a proximity effect, a greater resolution can be expected in STM and SFM lithography than with high-energy electrons (50 keV).

EXAMPLE 2

A silicon wafer is coated with amorphous hydrogen-containing carbon (layer thickness 200 nm) with an optical energy gap of 0.85 eV in a methane-filled PECVD system (parallel plate reactor, 3-inch cathode with a 13.56 MHz transmitter, anode six times larger); deposition parameters: −900 V self-bias voltage, 0.1 mbar methane pressure; 3 min deposition time. Then a 45 nm thick layer of a commercial electron beam-sensitive resist based on novolak (AZ 5214E, diluted 1:6 with methoxypropyl acetate) is applied to this layer by spin coating and dried at 110° C. for 90 s on a hot plate. The top layer is then "exposed" by means of a scanning force microscope (SFM device) by scanning the specimen with the tip of the probe, which receives −35 V, at the rate of 3 $\mu$m/s and thus "writing" lines (current: <100 pA). Then the wafer is heated at 130° C. for 90 s on a hot plate, exposed over the entire area with near UV light (20 mJ/cm$^2$) and then developed for 20 s in a commercial aqueous alkaline developer solution (AZ 400K, diluted 1:4 with water). Next, the wafer is treated for 60 s with a silylation solution consisting of a 12% solution of bis(dimethylamino)dimethylsilane in a mixture of methoxypropyl acetate and n-decane (ratio 1:1). The layer thickness of the resist increases by 15 nm to a total of 60 nm. The structures produced in this way are transferred to the amorphous hydrogen-containing carbon layer by means of a plasma etching system (model MIE 720, MRC) at an RF power of 900 W (45 V self-bias voltage) and an oxygen flow of 30 sccm (3 $\mu$bar). The etching time here is 38 s (including 50% overetching), where the thickness of the photoresist layer decreases to 20 nm and lines with a structure width of 100 nm are formed (negative image). The aspect ratio of the structures in the carbon layer is thus 2. The resist structure is then transferred to the silicon wafer by means of a $CF_4$ plasma, where the maximum possible etching depth is determined by the resist layer thickness and the etching selectivity; in the present case this is 6×200 nm. In practice, however, the etching depth is less than 50% of the maximum value.

EXAMPLE 3 (COMPARATIVE EXPERIMENT)

A silicon wafer is coated with amorphous hydrogen-containing carbon (layer thickness 250 nm) with an optical energy gap of 1.1 eV in a methane-filled PECVD system (parallel plate reactor, 3-inch cathode with a 13.56 MHz transmitter, anode six times larger); deposition parameters: −650 V self-bias voltage, 0.15 mbar methane pressure, 4.5 min deposition time. A 45 nm thick layer of an electron beam-sensitive resist according to Example 1 is applied to this layer by spin coating and dried at 120° C. for 60 s on a hot plate. In an attempt to "expose" the top layer by means of a scanning tunneling microscope (STM device) according to Example 1, charging effects that limit the maximum current are observed. Therefore, the structures cannot be developed completely to the a-C:H layer.

EXAMPLE 4

In a sputtering system (model Z 550, Leybold) with a rotatable sputtering target (made of carbon), the substrate disk is loaded with a silicon wafer coated with aluminum, then the chamber is evacuated with a turbo pump to a pressure of $9 \times 10^{-7}$ mbar. To clean the substrate (coated wafer) a pressure of $5 \times 10^{-3}$ mbar is established at an argon flow of 50 sccm and an oxygen flow of 5 sccm, and then sputtering is performed at a high-frequency power of 300 W for 3 minutes with both process gases. Then the oxygen flow is stopped and sputtering is performed for 3 minutes more with pure argon. For the coating process, a d.c. voltage plasma is ignited on the carbon target (argon flow 75 sccm) and sputtering is performed blind first (to clean the target) for 3 minutes at 500 W (pressure $7.1 \times 10^{-3}$ mbar). Then the sputtering target is moved over the substrate and sputtering is continued for 900 s more, yielding a very hard, adhesive amorphous carbon layer approx. 250 nm thick with a sufficient electric conductivity. A 45 nm thick layer of an electron beam-sensitive resist according to Example 1 is applied to this layer by spin coating and dried at 120° C. for 60 s on a hot plate. Then the top layer is "exposed" by means of a scanning tunneling microscope (STM device) by scanning the specimen with the tip of the probe, which receives −50 V, at the rate of 1 $\mu$m/s and thus "writing" lines (current 10 pA). Then the substrate is heated at 120° C. for 120 s on a hot plate and next developed for 60 s in an aqueous developer solution of tetramethylammonium hydroxide (1.19%) and 1-phenylethylamine (0.25%), yielding 150 nm wide spaces corresponding to the scan pattern (positive image); the dark field erosion in developing amounts to 5 nm. Next the substrate is treated for 60 s with a silylation solution consisting of a 4% solution of diaminopropyldimethylsiloxane oligomer in 2-propanol. The layer thickness of the resist increases by 40 nm to a total of 80 nm, and the space width decreases from 150 nm to 90 nm. The structures produced in this way are transferred to the sputtered amorphous carbon layer by means of a plasma etching system (model MIE 720, MRC) at an RF power of 900 W (45 V self-bias voltage) and an oxygen flow of 30 sccm (3 $\mu$bar). The etching time is 36 s (including 50% overetching), where the thickness of the photoresist layer decreases to 30 nm and the space width of the structures increases to 100 nm. The aspect ratio of the structures in the carbon layer is thus 2.5. The resist structure is then transferred to the aluminum layer by means of a $CF_4$ plasma, where the maximum possible etching depth is determined by the resist layer thickness and the etching selectivity; in the present case this is 4×250 nm. In practice, however, the etching depth is less than 50% of the maximum value.

EXAMPLE 5

A silicon wafer is coated with amorphous hydrogen-containing carbon (layer thickness 350 nm) with an optical energy gap of 0.85 eV in a methane-filled PECVD system (parallel plate reactor, 3-inch cathode with a 13.56 MHz transmitter, anode six times larger); deposition parameters: −900 V self-bias voltage, 0.1 mbar methane pressure, 7 min deposition time. Then a 45 nm thick layer of an electron beam-sensitive resist according to Example 1 is applied to this layer by spin coating and dried at 120° C. for 60 s on a hot plate. The top layer is then "exposed" by means of a scanning tunneling microscope (STM device) by scanning the specimen with the tip of the probe, which receives −55 V, at the rate of 1 $\mu$m/s and thus "writing" lines (current 20 pA). Then the wafer is heated at 120° C. for 120 s on a hot plate and then treated for 60 s with a silylation solution consisting of a 1% solution of diaminopropyldimethylsiloxane oligomer in a mixture of 2-propanol and water (ratio 15.5: 1). The layer thickness of the resist increases by 40 nm to a total of 80 nm in the "exposed" areas. The structures produced in this way are transferred to the amorphous hydrogen-containing carbon layer by means of a plasma etching system (model MIE 720, MRC) at an RF power of 900 W (45 V self-bias voltage) and an oxygen flow of 30 sccm (3 $\mu$bar). The etching time is 74 s (including 50% overetching), where the thickness of the photoresist layer decreases to 45 nm and structures with a line width of 80 nm are formed (negative image). The aspect ratio of the structures in the carbon layer thus amounts to 4.3. The resist structure is then transferred to the silicon wafer by means of a $CF_4$ plasma, where the maximum possible etching depth is determined by the resist layer thickness and the etching selectivity; in the present case this is 6×350 nm. In practice, however, the etching depth amounts to less than 50% of the maximum value.

What is claimed is:

1. A process for photolithographic generation of structures in the sub-200 nm range, comprising the steps of: applying a layer of amorphous hydrogen-containing carbon (a-C:H) having an optical energy gap of <1 eV to a substrate as a bottom resist having a layer thickness of $\leq$500 nm; applying to the bottom resist a layer of an electron beam-sensitive silicon-containing or silylatable photoresist having a layer thickness of $\leq$50 nm as a top resist; exposing the top resist by scanning tunneling microscopy or scanning force microscopy with electrons of an energy of $\leq$80 eV to form a pattern after development; transferring the pattern to the bottom resist by etching with an anisotropic oxygen plasma and then to the substrate by plasma etching.

2. The process according to claim 1, wherein the exposing is performed with a radiation dose in a range of 1–50 mC/cm$^2$.

3. The process according to claim 2, wherein the pattern is transferred to the substrate by etching with a halogen plasma.

4. The process according to claim 3, wherein the substrate is a semiconductor material.

5. The process according to claim 3, wherein the top resist is treated with a silicon-containing agent after developing.

6. The process according to claim 2, wherein the substrate is a semiconductor material.

7. The process according to claim 6, wherein the top resist is treated with a silicon-containing agent after developing.

8. The process according to claim 2, wherein the top resist is treated with a silicon-containing agent after developing.

9. The process according to claim 1, wherein the exposing is performed with a radiation dose in a range of 10–30 mC/cm$^2$.

10. The process according to claim 1, wherein the pattern is transferred to the substrate by etching with a halogen plasma.

11. The process according to claim 10, wherein the substrate is a semiconductor material.

12. The process according to claim 10, wherein the top resist is treated with a silicon-containing agent after developing.

13. The process according to claim 1, wherein the substrate is a semiconductor material.

14. The process according to claim 12, wherein the top resist is treated with a silicon-containing agent after developing.

15. The process according to claim 1, wherein the top resist is treated with a silicon-containing agent after developing.

* * * * *